(12) United States Patent
Chakrabarty et al.

(10) Patent No.: US 8,775,108 B2
(45) Date of Patent: Jul. 8, 2014

(54) METHOD AND ARCHITECTURE FOR PRE-BOND PROBING OF TSVS IN 3D STACKED INTEGRATED CIRCUITS

(75) Inventors: Krishnendu Chakrabarty, Chapel Hill, NC (US); Brandon Noia, Durham, NC (US)

(73) Assignee: Duke University, Durham, NC (US)

( * ) Notice: Subject to any disclaimer, the term of this patent is extended or adjusted under 35 U.S.C. 154(b) by 392 days.

(21) Appl. No.: 13/172,161

(22) Filed: Jun. 29, 2011

(65) Prior Publication Data

US 2013/0006557 A1   Jan. 3, 2013

(51) Int. Cl.
*G01R 25/00* (2006.01)
*G01R 31/3185* (2006.01)
*G01R 31/317* (2006.01)
*G01R 31/28* (2006.01)

(52) U.S. Cl.
CPC .... *G01R 31/318538* (2013.01); *G01R 31/2853* (2013.01); *G01R 31/31717* (2013.01); *G01R 31/318541* (2013.01)
USPC .......................................... 702/65; 438/108

(58) Field of Classification Search
USPC .......................................................... 702/65
See application file for complete search history.

(56) References Cited

U.S. PATENT DOCUMENTS

| | | | | |
|---|---|---|---|---|
| 3,618,039 A * | 11/1971 | Baltzly et al. | ...................... | 710/1 |
| 5,640,404 A * | 6/1997 | Satish | ............................ | 714/727 |
| 5,784,384 A * | 7/1998 | Maeno | ........................... | 714/726 |
| 5,881,067 A * | 3/1999 | Narayanan et al. | ........... | 714/726 |
| 5,951,702 A * | 9/1999 | Lim et al. | ....................... | 714/718 |
| 6,057,954 A * | 5/2000 | Parayanthal et al. | ......... | 359/248 |
| 6,182,256 B1 * | 1/2001 | Qureshi | ......................... | 714/726 |
| 6,252,448 B1 * | 6/2001 | Schober | ......................... | 327/259 |
| 7,739,568 B1 * | 6/2010 | Bertanzetti | .................... | 714/729 |
| 7,793,180 B1 * | 9/2010 | Shrivastava | ................... | 714/726 |
| 7,978,554 B2 * | 7/2011 | Kim et al. | .................. | 365/210.1 |
| 8,024,631 B1 * | 9/2011 | Bertanzetti | .................... | 714/729 |
| 8,107,777 B2 * | 1/2012 | Farah | ............................... | 385/14 |
| 8,373,493 B2 * | 2/2013 | Chakrabarty et al. | ........ | 327/427 |
| 8,436,639 B2 * | 5/2013 | Goel | ............................... | 326/16 |
| 8,461,904 B2 * | 6/2013 | Kim et al. | ..................... | 327/427 |
| 2002/0049927 A1 * | 4/2002 | Yamamura et al. | ............ | 714/30 |
| 2002/0184584 A1 * | 12/2002 | Taniguchi et al. | ............ | 714/726 |
| 2003/0218488 A1 * | 11/2003 | Parulkar et al. | ............... | 327/218 |
| 2004/0119502 A1 * | 6/2004 | Chandar et al. | ................. | 326/96 |
| 2006/0154282 A1 * | 7/2006 | Park et al. | ......................... | 435/6 |

(Continued)

OTHER PUBLICATIONS

Marinissen, E. J. et al., "A Structured and Scalable Test Access Architecture for TSV-Based 3D Stacked ICs," 28th IEEE VLSI Test Symposium, 2010, pp. 269-274.

*Primary Examiner* — Sujoy Kundu
*Assistant Examiner* — Alvaro Fortich
(74) *Attorney, Agent, or Firm* — Saliwanchik, Lloyd & Eisenschenk

(57) ABSTRACT

On-chip test architecture and design-for-testability methods for pre-bond testing of TSVs are provided. In accordance with certain embodiments of the invention, a die level wrapper is provided including gated scan flops connected to one end of each TSV. The gated scan flops include a scan flop structure and a gated output. The gated output is controlled by a signal to cause the output of the gated scan flop to either be in a "floated state" or take the value stored in the flip-flop portion of the gated scan flop. The gated output of the gated scan flop can be used to enable resistance and capacitance measurements of pre-bonded TSVs.

18 Claims, 11 Drawing Sheets

(56) References Cited

U.S. PATENT DOCUMENTS

| | | |
|---|---|---|
| 2006/0238210 A1* | 10/2006 | Goto .................... 324/754 |
| 2007/0096957 A1* | 5/2007 | Papaefthymiou et al. ...... 341/51 |
| 2007/0229133 A1* | 10/2007 | Tam et al. .................... 327/218 |
| 2007/0234141 A1* | 10/2007 | Ausserlechner .............. 714/718 |
| 2007/0255987 A1* | 11/2007 | Abhishek .................... 714/726 |
| 2008/0195904 A1* | 8/2008 | Wang .................... 714/726 |
| 2010/0088560 A1* | 4/2010 | Chakravarthy et al. ....... 714/724 |
| 2010/0264932 A1* | 10/2010 | Marinissen et al. ........... 324/537 |
| 2011/0010593 A1* | 1/2011 | Shrivastava .................. 714/727 |
| 2011/0080184 A1* | 4/2011 | Wu et al. .................... 324/750.3 |
| 2011/0080185 A1* | 4/2011 | Wu et al. .................... 324/750.3 |
| 2011/0102006 A1* | 5/2011 | Choi et al. .................. 324/750.3 |
| 2011/0113286 A1* | 5/2011 | Takasuka et al. ................ 714/30 |
| 2011/0304353 A1* | 12/2011 | Lee et al. ........................ 326/16 |
| 2012/0025846 A1* | 2/2012 | Minas et al. .................. 324/606 |
| 2012/0038388 A1* | 2/2012 | Tseng et al. ...................... 326/52 |
| 2012/0072797 A1* | 3/2012 | Devta-Prasanna ............ 714/731 |
| 2012/0131526 A1* | 5/2012 | Schreiber et al. ............. 716/110 |
| 2012/0159274 A1* | 6/2012 | Balakrishnan et al. ........ 714/732 |
| 2012/0166131 A1* | 6/2012 | Srinivasan .................... 702/120 |
| 2012/0166900 A1* | 6/2012 | Dimri ........................... 714/726 |
| 2012/0286814 A1* | 11/2012 | Wang et al. .............. 324/754.03 |

\* cited by examiner

Second Contact Test Networks

METHOD AND ARCHITECTURE FOR PRE-BOND PROBING OF TSVS IN 3D STACKED INTEGRATED CIRCUITS

This invention was made with government support under Grant No. CCF-1017391 awarded by the National Science Foundation. The U.S. Government has rights in this invention.

BACKGROUND

In an effort to produce high-performance and low-power chips, the semiconductor industry has initiated the exploration and manufacture of three-dimensional (3D) integrated circuits (ICs) based on die stacking and through-silicon-vias (TSVs). To manufacture a 3D IC, multiple dies are produced with their own active device and metal layers. Vertical TSVs are embedded in the silicon of the die wafer and connect to metal layers of the chip. The TSVs are typically in the form of a metal pillar that extends into the silicon substrate through the active device area. The TSVs may be located in or near the scribe lane, or may be in areas designated as not having an active device.

After fabricating each die's TSVs and active device and metal layers, the dies are thinned through grinding, exposing the TSVs through the bottom of the die. The thinned dies are bonded to one another in a vertical stack to produce a functional stacked IC (SIC). The TSVs connect each die to the dies immediately adjacent to it, thus playing the role of interconnects in the SICs.

As with any fabricated component, defects may occur during the manufacturing process of TSVs that can degrade product quality. Therefore, testing schemes are important in order to manufacture reliable chips.

TSV testing can be separated into two distinct categories: pre-bond testing and post-bond testing. Pre-bond testing is directed to detecting defects that are inherent in the manufacture of the TSV itself, such as impurities or voids, while post-bond testing is directed to detecting faults caused by thinning, alignment, and bonding.

There are a number of pre-bond defects that can impact chip functionality. These include incomplete metal filling (or microvoids) in the TSVs, which increase resistance and path delay; partial breaks in the TSV, which result in a resistive path; and complete breaks in the TSV, which result in an open path. In addition, impurities in the TSV may also increase resistance and interconnect delay; and pinhole defects can lead to a leakage path to the substrate, with a corresponding increase in the capacitance between the TSV and the substrate. Since methods to "unbond" die are yet to be realized, even one faulty die can cause the entire stacked IC to be discarded, including all the good dies in the stack.

FIGS. 1A and 1B illustrate a microvoid defect and a pinhole defect, respectively, of a TSV. Referring to FIGS. 1A and 1B, a TSV is disposed in the substrate and can take the form of a metal pillar. The TSV may be formed by etching the substrate to form a deep via or trench, depositing a barrier material in the deep via or trench, and then depositing the material forming the TSV. When depositing the material forming the TSV in the deep via or trench, a microvoid, as shown in FIG. 1A, may occur in the TSV. This microvoid increases the resistance of the TSV. The pinhole defect, as shown in FIG. 1B, may occur from uneven forming of the barrier material and causes leakage between the TSV and the substrate, increasing the TSV capacitance.

Although interest in 3D-SIC testing has surged in the past year and a number of test and design for test (DFT) solutions have been proposed, pre-bond TSV testing remains a major challenge.

In particular, pre-bond testing of TSVs continues to be difficult due, in part, to TSV pitch and density. Specifically, TSV dimensions are generally much smaller than the probe needles used by probe cards, which makes direct probing of single TSVs effectively unfeasible. For example, current probe technology using cantilever or vertical probes require a minimum pitch of 35 µm, but TSVs currently have diameters of only 5 µm and pitches of 10 µm or smaller, resulting in the probe contacting multiple TSVs at one time unless large probe pads are provided for the individual TSVs.

Furthermore, since TSVs are single-ended in the dies at a pre-bond stage, built-in self-test (BIST) techniques tend to suffer from limitations in terms of observability and the types of measurements that are feasible. In particular, current BIST approaches tend to not be able to detect all types of defects and often require careful calibration and tuning. In addition, current BIST approaches tend to add considerably to die-area cost because the additional test structures per TSV and/or complex routing for each TSV used in the current BIST approaches occupy a relatively large die area.

Moreover, since a chip can have many TSVs with densities of $10000/mm^2$ or more and the amount of on-die area used for test grows with the number of TSVs on the chip, many BIST methods do not scale well (particularly those that use large on-die analog elements such as resistors and capacitors).

However, because TSV yield has been recognized as a major concern for the semiconductor industry, it is important to screen defective dies through pre-bond testing prior to bonding and stacking.

BRIEF SUMMARY

Embodiments of the invention provide methods and architectures for pre-pond probing of TSVs in 3D ICs. In one embodiment, a modified scan flop, referred to herein as a gated scan flop, is provided as embedded test architecture that can be used for TSV testing in accordance with certain embodiments of the invention.

In accordance with certain embodiments of the invention, capacitance, resistance, leakage, and stuck-at pre-bond TSV tests are combined in a single unified test scheme. By using the subject embedded architecture and a probe card configured in accordance with an embodiment of the invention, existing test set-ups can be utilized to provide pre-bond testing of TSVs.

Successful pre-bond defect screening in accordance with embodiments of the invention can allow defective dies to be discarded before stacking. Moreover, pre-bond testing and diagnosis can facilitate defect localization and repair prior to bonding.

According to one aspect of the invention, testing structures for measuring resistance and capacitance are provided external to the chip (in the probe head electronics), which allows for these test structures to be well characterized prior to testing. In addition, large analog components provided in on-die architectures for such testing structures can be avoided.

According to another aspect of the invention, accurate resistance measurements of TSVs can be achieved, as opposed to comparisons to voltage dividers or sense amplifiers.

According to an aspect of the invention, testing can be accomplished with less susceptibility to process variation as compared to many BIST approaches.

According to yet another aspect of the invention, many test features that exist for post-bond TSV testing can be re-used for the pre-bond TSV testing. These test features include built-in scanning architecture and current probe technology.

In accordance with certain embodiments of the invention, a die level wrapper is provided including gated scan flops connected to one end of each TSV. The gated scan flops include a scan flop structure and a gated output. The scan flop structure can be any suitable scan flop used for scan design. However, in accordance with the invention, the scan flop includes a gated output such that the output of the scan flop is controlled by an "Open" signal to either be in a "floated state" or take the value stored in the flip-flop. In one embodiment, the gated output is provided by a transmission gate.

DETAILED DISCLOSURE

Embodiments of the invention provide methods and architectures for pre-pond probing of TSVs in 3D ICs. Successful pre-bond defect screening in accordance with embodiments of the invention can allow defective dies to be discarded before stacking. Moreover, pre-bond testing and diagnosis can facilitate defect localization and repair prior to bonding.

In accordance with embodiments of the invention, a gated scan flop is presented for use as part of the embedded test architecture. The subject gated scan flop can enable pre-bond TSV testing. In certain embodiments of the invention, the subject gated scan flops are incorporated into a die level wrapper and connected to one end of each TSV. The subject gated scan flops can also be used as part of core level wrapper technologies. To provide the TSV test architecture, the subject gated scan flops include a scan flop structure and a gated output. The scan flop structure can be any suitable scan flop used for scan design. The given output at the gated output of the scan flop structure is configured to be in a floated state or to take the value stored in the flip-flop according to a control signal applied to the gated output. This is accomplished, for example, using a transmission gate.

Figure 1A:
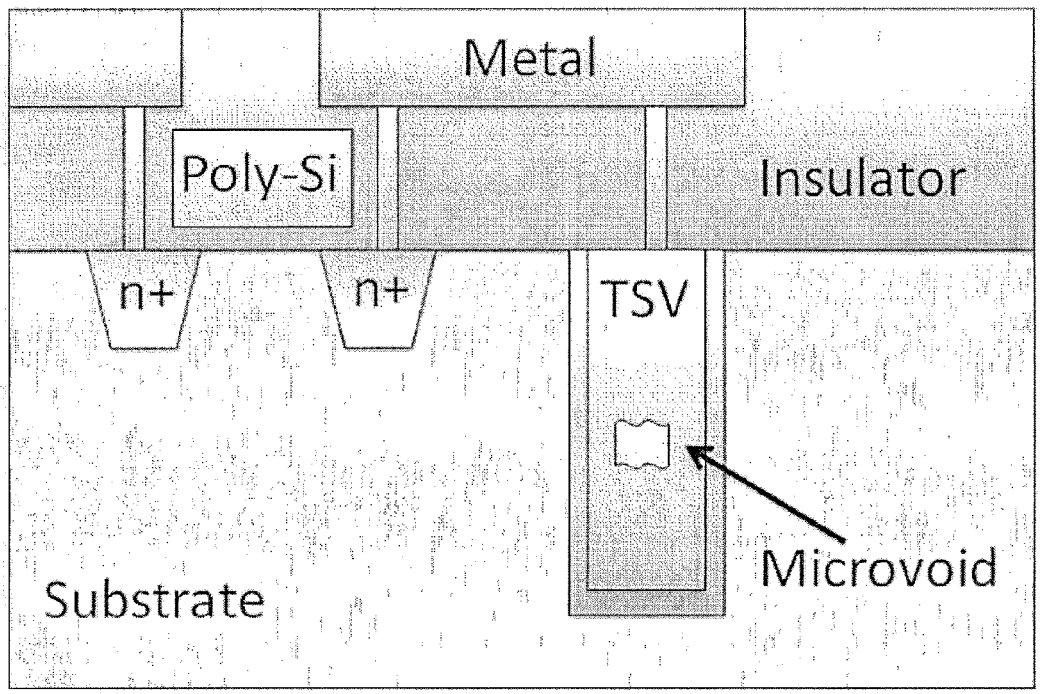
FIG. 1A illustrates a microvoid defect of a TSV.
Figure 1B:
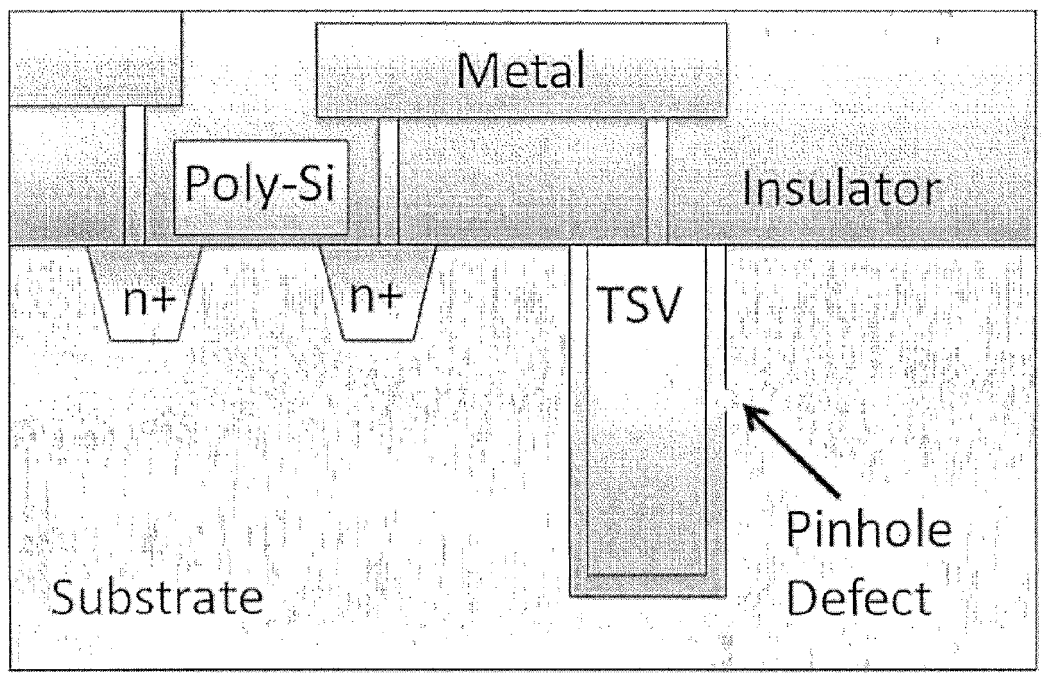
FIG. 1B illustrates a pinhole defect of a TSV.
Figure 2A:
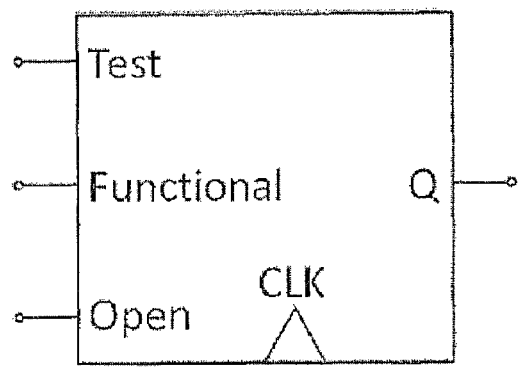
FIG. 2A shows a symbol block of a gated scan flop of an embodiment of the invention.
Figure 2B:
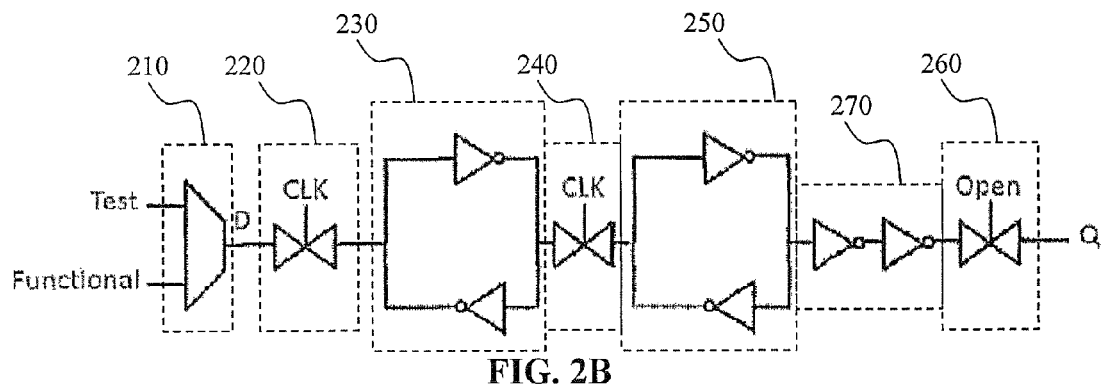
FIG. 2B shows a gate level schematic of a gated scan flop according to an embodiment of the invention.
Figure 2C:
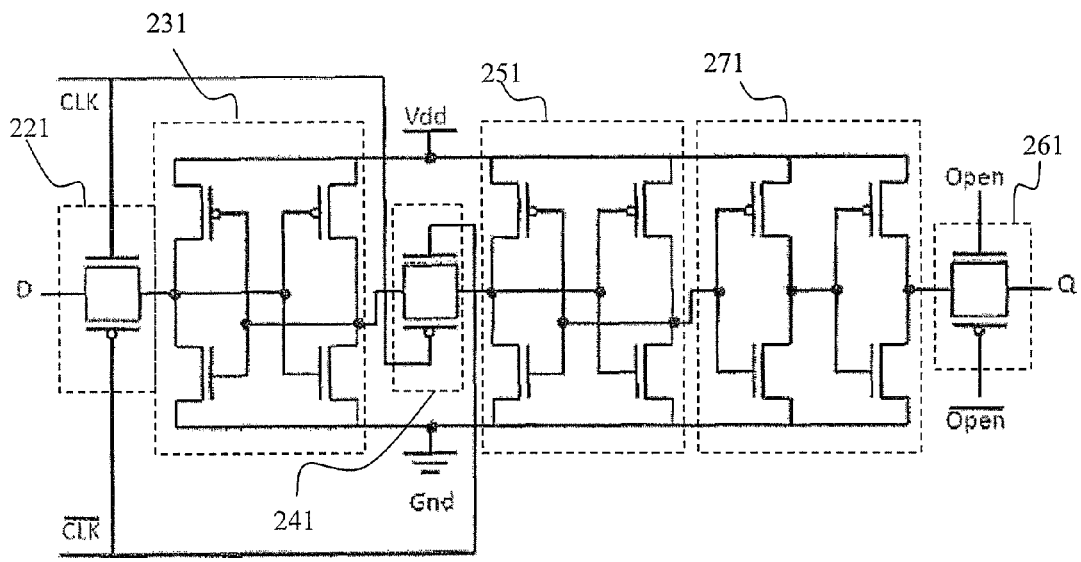
FIG. 2C shows a transistor level schematic of a gated scan flop according to an embodiment of the invention.

FIGS. 2A-2C illustrate varying levels of detail for a gated scan flop in accordance with embodiments of the invention. For certain embodiments of the invention, the subject gated scan flop is used instead of standard scan-flops of IEEE 1500-compliant or similar wrapper architecture.

Referring to the block level symbol shown in FIG. 2A, the gated scan flop accepts either a functional input (similar to "D" of a conventional scan-flop) or a test input from the scan chain (similar to test input "TI" of a conventional scan-flop). Although the input is not shown in the symbol block, the selection between the functional input and the test input is made depending on operational mode (in one embodiment, this is carried out similar to test enable "TE" of a conventional scan-flop). According to embodiments of the invention, in addition to the conventional inputs of a scan-flop, the subject gated scan-flop includes an "open signal" to determine whether the output Q floats or takes the value stored in the flip-flop.

FIG. 2B illustrates a gate level design of the subject gated scan flop in accordance with an embodiment of the invention. As shown in FIG. 2B, the subject gated scan flop can include a MUX (test enable control signal not shown) 210 receiving the Test and Functional inputs to output a selected one as input "D," which is passed via a first transmission gate 220 controlled by the clock CLK to a first delay latch 230. The signal is then passed via a second transmission gate 240 also controlled by the clock CLK to a second delay latch 250. The delay latches 230, 250 can be in the form of cross-coupled inverters for storing the data. In accordance with embodiments of the invention, a gated output is used to control whether the output Q floats or takes the value stored in the flop. In the embodiments shown in FIG. 2B, the gated output is a third transmission gate 260 that is controlled by the signal Open.

Output buffers 270 can be provided before the signal is output to Q. These buffers can be configured such that the gated scan flop can drive a large capacitance on its output net without altering the value held in the flop.

In an alternate embodiment, the output buffers 270 and third transmission gate 260 can be replaced with a tri-state buffer where the Open signal is provided at the control input.

FIG. 2C illustrates a transistor level design of the subject gated scan flop in accordance with an embodiment of the invention. The transistor level design shown in FIG. 2C begins from input D before passing through the first transmission gate 221 to first cross-coupled inverter stage 231. The widths of the transistors in the first cross-coupled inverter stage 231 are greater than the widths of the transistors in the second cross-coupled inverter stage 251 such that the second stage takes the value of the first stage when the buffer between them is open (e.g., transmission gate 231) and they are in contention. Two internal inverter buffers 271 are included before the third transmission gate 261 at the gated scan flop output such that the gated scan flop can drive a large capacitance on its output net without altering the value held in the flop. The "open" signal controls the third transmission gate 261, whereas the CLK controls the first and second transmission gates 221, 241. In certain embodiments, a single transistor may be used for one or more of the transmission gates instead of the NMOS/PMOS pair.

According to one embodiment, a gated scan flop can be formed on-chip to be connected to one end of a TSV such that each TSV is driven by its own gated scan flop. A TSV matrix can be defined as the TSVs for which a single probe needle is used to test. The number of TSVs in a matrix depends on the size of the probe needle and the probe card design.

In addition to the gated scan flops, additional test structures can be included to control the gated scan flops. For example, a controller can be used for determining which gates are "open" in the TSV matrix at any given time. That is, the controller can provide the "open" signal to the third transmission gate to allow the output of the gated scan flop to float or take the value stored in the flip-flop.

Figure 3:
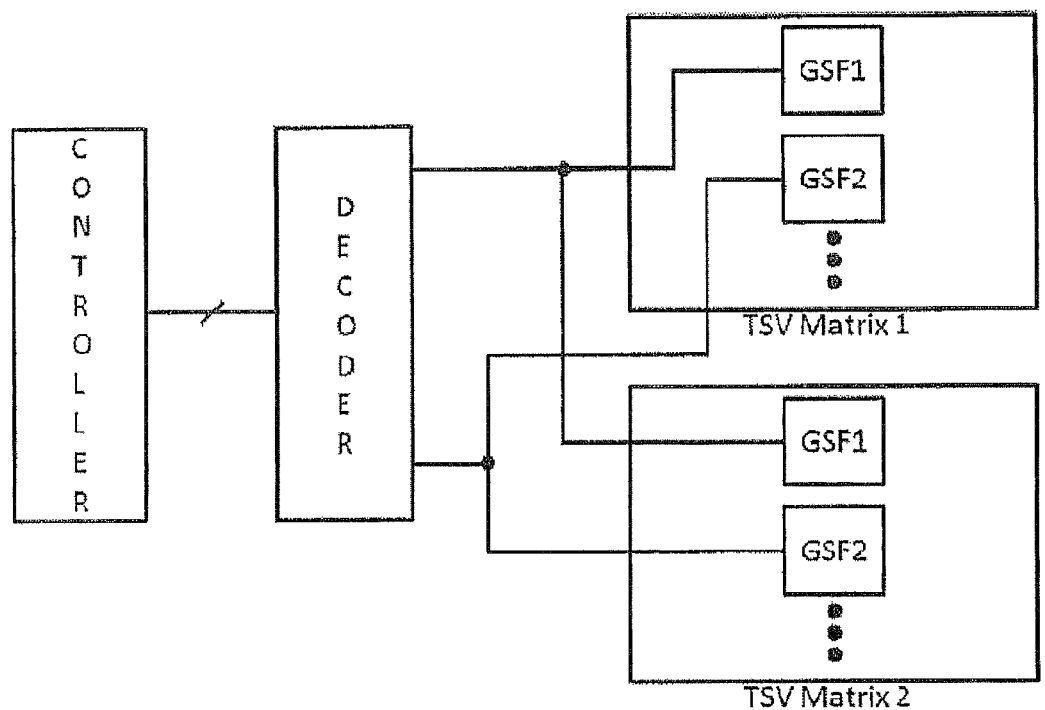
FIG. 3 shows a diagram of control architecture for pre-bond probing of TSVs according to an embodiment of the invention.

In one embodiment, as shown in FIG. 3, a centralized gate controller that is routed through a decoder is used to control gates of the gated scan flops (GSF1, GSF2, . . . ) in each TSV matrix simultaneously. Since each matrix is contacted by its own probe needle, TSVs in one matrix can be tested in parallel with TSVs in each other matrix contacted by a probe needle. Although a specific example of a controller is provided herein, the controller should not be construed as being limited to the specific example. Rather, the controller can be any existing or added controller component so long as the functions of providing the "open" signal is capable of being performed.

Figure 4:
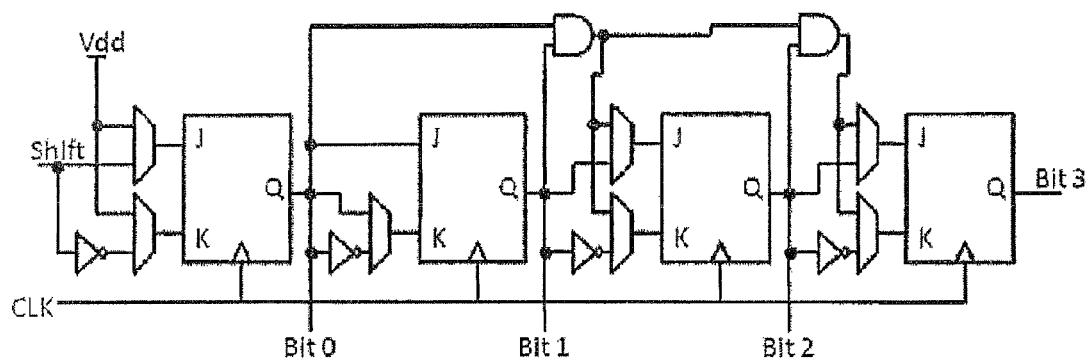
FIG. 4 shows a schematic of a shift counter according to an embodiment of the invention.

FIG. 4 shows one embodiment of a controller that can be used for determining the "open" gates of the TSV matrix. Referring to FIG. 4, a synchronous up counter based on J/K flip-flops is provided that can also be used as a shift register. The controller shown in FIG. 4 includes four bits; however, any suitable sized controller can be used so long as the controller has enough bits to address all the gated scan-flops in the largest TSV matrix during test. For example, any controller having $\log_2(n)$ bits, where n is the number of gated scan-flops in the largest TSV network during test, may be used. In normal operation, the controller counts up, cycling through the gated scan-flops in each matrix for test. If a specific TSV needs to be tested or special test codes need to be sent to the decoder, then the appropriate data can be shifted into the controller. Although outputs from the decoder are routed to each TSV network, the number of wires from the decoder to the TSV network can be the number of TSVs in the largest network, which simplifies the routing.

In accordance with certain embodiments of the invention, capacitance, resistance, leakage, and stuck-at pre-bond TSV tests are combined in a single unified test scheme. In order to carry out the testing, a gated scan flop is provided as part of the embedded test architecture of the chip. In certain embodiments, the subject gated scan flop can be a part of die-level wrapper technology used in modular scan testing schemes in place of conventional scan flops. In one embodiment, the subject gated scan flop can be a part of the on-die scan architecture used for post-bond testing of the TSVs.

Existing probe and test-set-ups can be utilized. For example, the testing arrangement can include a movable probe head and a rigid platter (carrier) for supporting the thinned die and inhibiting mechanical damage to the thinned die during probing.

According to one embodiment, a method of performing pre-bond testing is provided that includes shorting together a number of TSVs through contact with a probe needle to form a matrix of TSVs; determining the capacitance of the TSVs through an active driver in the probe head itself; and determining the resistance of each TSV by asserting each TSV on to the shorted net.

A probe card can be provided that allows for the concurrent testing of many TSVs. In addition, in one embodiment, the probe card and probe head (with needles) is moved once to test all of the TSVs on the chip under test.

In pre-bond probing of TSVs, surface planarity of the TSVs (or the microbumps of the TSVs used for flip chip interconnection) impacts the consistency of contact between the probe needles and the TSVs. Therefore, "spring-loaded" probe technologies can be used to facilitate pre-bond probing of TSVs by providing varying degrees of individual control of contacts involving probe needles. Some spring-loaded probe technologies include membrane probe cards, thermally-actuated probe needles, and probe needles with electrostatic actuators. In some cases, the microbumps may be planarized before testing. The subject testing techniques can be carried out regardless of the size and pitch of the probe technology being used. Further, embodiments can be carried out regardless of whether the TSVs are being tested with or without microbumps.

In accordance with certain embodiments of the invention, a testing method of TSVs is provided that, in conjunction with the gated scan-flops such as described with respect to FIGS. 2A-2C and 3, can perform pre-bond TSV testing using existing probes. The pre-bond testing for TSV defects can be accomplished by performing capacitance and resistance measurements of the TSVs. The testing can be accomplished using a probe needle that contacts a plurality of TSVs connected to the subject gated scan-flops forming a scan chain.

Figure 5A:
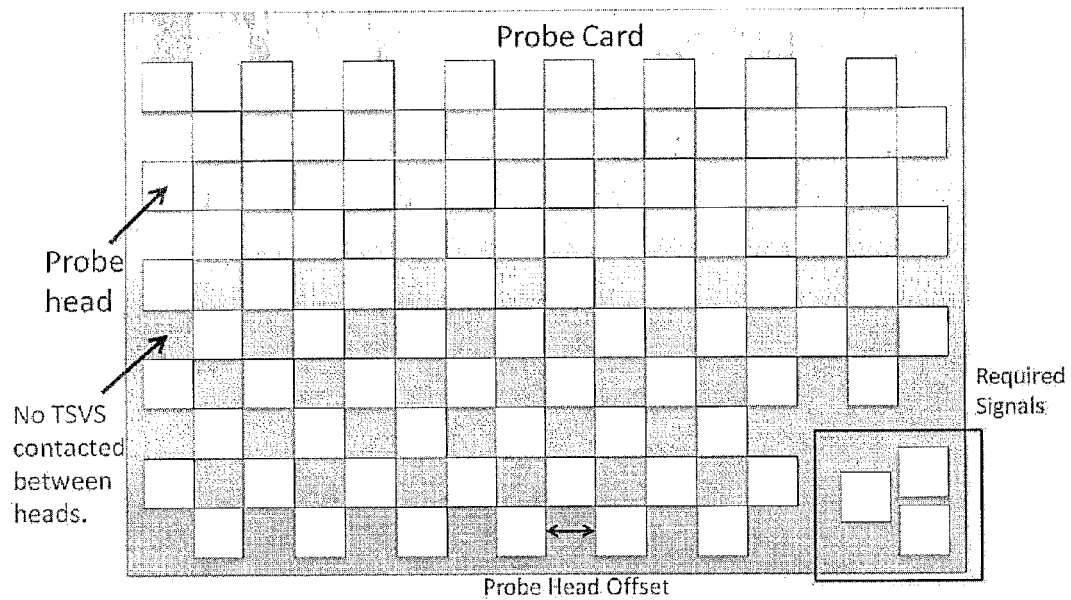
FIGS. 5A and 5B show configurations of a probe card for TSV testing in accordance with certain embodiments of the invention.
Figure 5B:
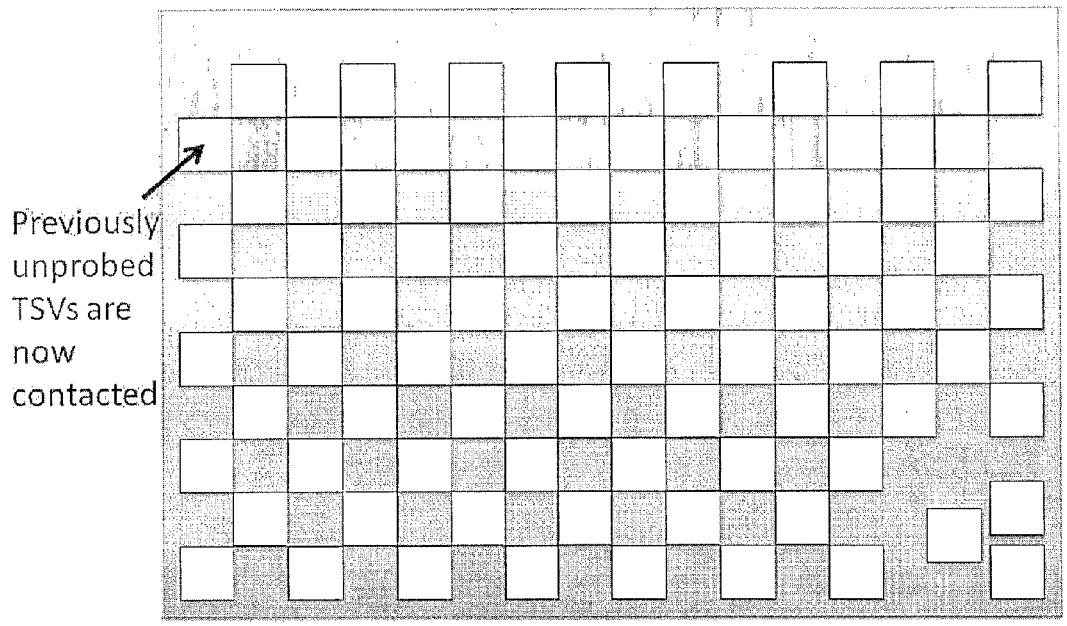

In one embodiment, a probe card is used to select the TSVs being tested. The probe card can then be moved to expose a next selection of TSVs. FIGS. 5A and 5B illustrate a specific example of a probe card that can be used.

In order to contact all TSV matrices, the probe card shown in FIG. 5A is used and then moved once to the position shown in FIG. 5B. By offsetting the probe needles in the checkerboard pattern as shown in FIG. 5A, the probe card is shifted up or down only once in order to contact all TSV matrices. In more detail, the probe card shown in FIG. 5A causes probe needles on the probe card to contact some groups of TSVs, with adjacent TSV networks having no probe needle to contact. The spacing between probe needles can be the probe needle offset. Then, referring to FIG. 5B, the probe card is shifted such that previously unprobed TSVs are now contacted. The shifting can be the distance of the probe needle offset. Special probe needles can be added to the card for contacting and supplying critical signals such as power and clocks to the die during test; these are labeled as "required signals" in FIG. 5A and are not placed in the same configuration as the other the probe needles. The probe needles for the "required signals" contact TSVs with large probe pads added to them.

Figure 6A:
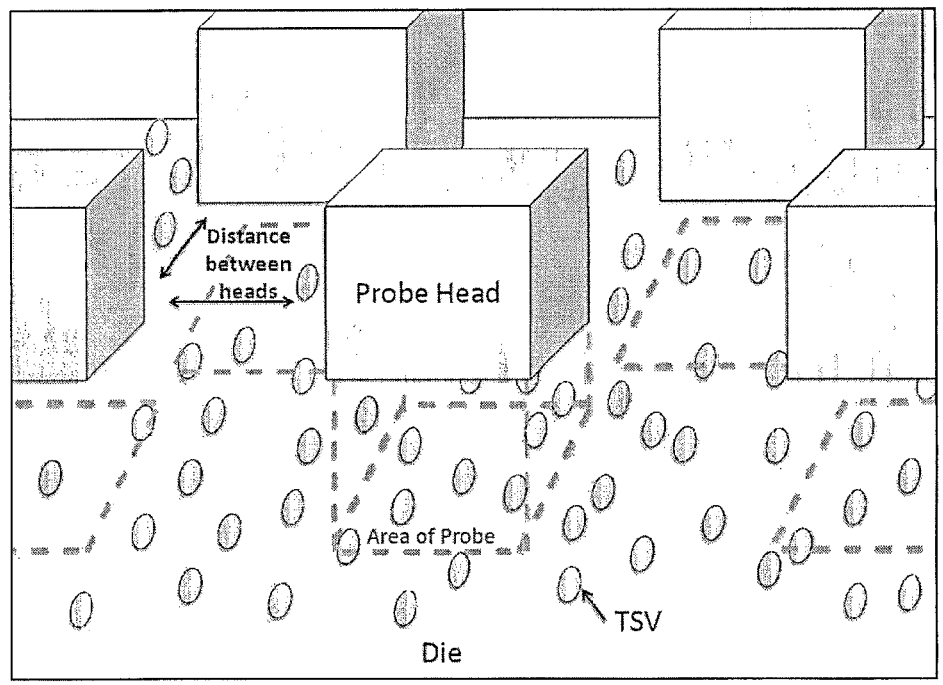
FIGS. 6A-6D show perspective views illustrating contact of a probe card onto a die with TSVs in accordance with an embodiment of the invention.

FIGS. 6A-6D illustrate how contact is made with the TSV networks on a die using a probe card as described with respect to FIGS. 5A and 5B. In FIG. 6A, a partial example of two rows of probe needles are shown above a die with TSVs. In the partial example, five probe needles are used with a first row having three needles and a second row having two needles.

Figure 6B:
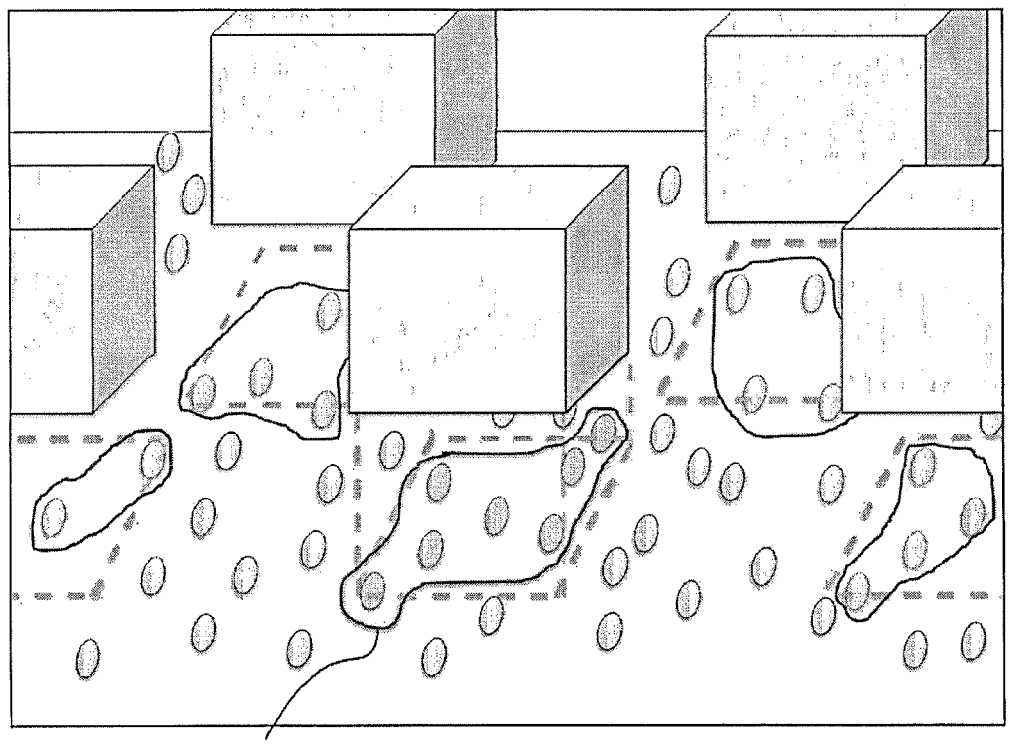
Figure 6C:
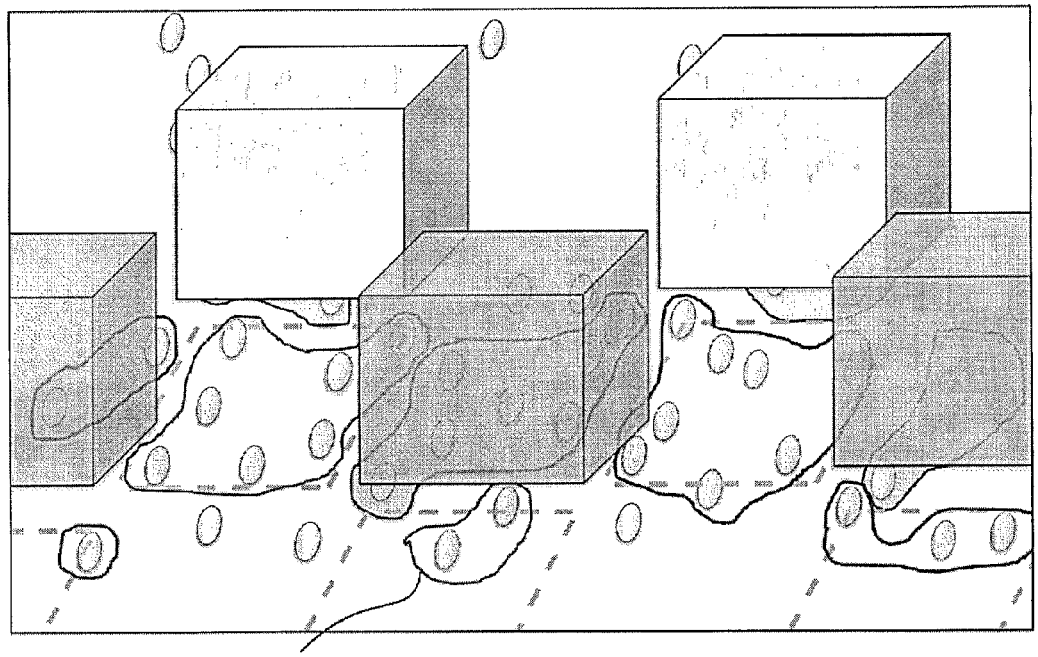
Figure 6D:
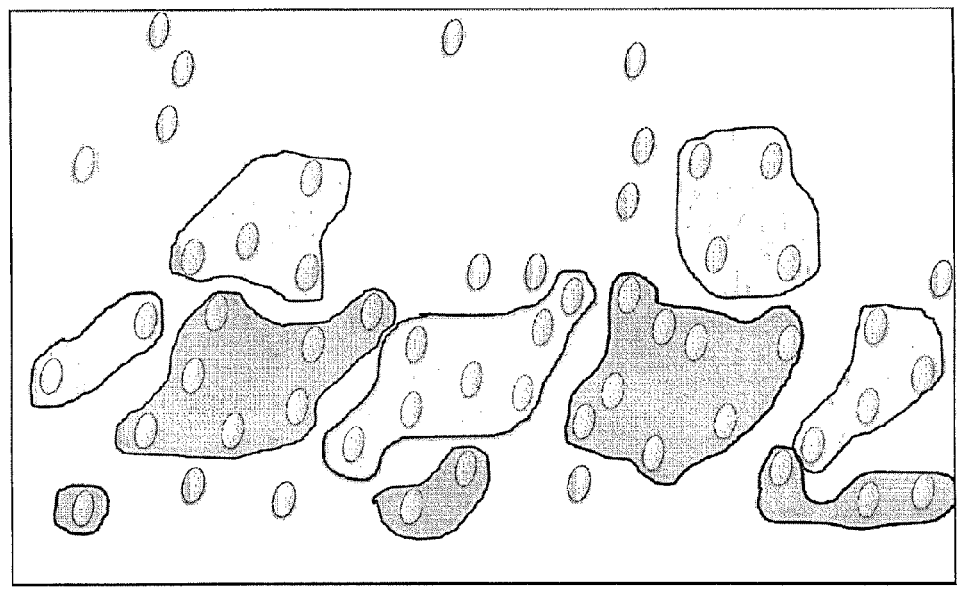

The TSVs are spaced in an irregular manner in this example. However, the placement and number of TSVs should also not be construed as limiting. In certain embodiments, the TSVs can have microbumps. Referring to FIG. 6B, the probe card can be lowered such that the contact is made between the probe needles and the TSVs below each needle (indicated within the doted lines). Each group of TSVs contacted by one of the probe needles comprises a TSV network. The TSVs contacted by the probe needles during the first step can be referred to as the first contact test networks and are shown encircled in the figure. As can be seen, any TSVs located within the area that the probe needle contacts belong in the group. Referring to FIG. 6C, the probe card is then lifted and shifted to its second configuration, contacting the newly highlighted TSVs (indicated within the doted lines and encircled as the second contact test networks). In FIG. 6C, the previously tested TSVs are shown in the shaded encircled regions. The second configuration can correspond to that shown in FIG. 5B. Accordingly, as illustrated in FIG. 6D, a row of TSVs can be completely contacted with a single movement of the probe card. Of course, since only two rows of probe needles were used in the example shown in FIGS. 6A-6D, only a single row is shown as complete. The first contact test networks are shown in the lightly shaded encircled regions and the second contact test networks are shown in the darker shaded encircled regions.

By limiting the number of contacts the probe needle makes with each TSV, it is possible to minimize damage, such as scrubbing, that may occur during test. If a single TSV is contacted more than once, or in more than one TSV network during test, additional control signals can be included in the controller to close the gates for all TSVs tested in the first test period during the second test period, and vice versa.

As previously mentioned, conventional probe needles can be used to perform the pre-bond testing. To enable capacitance and resistance measurements, the conventional probe needles are configured with an active driver.

Figure 7:
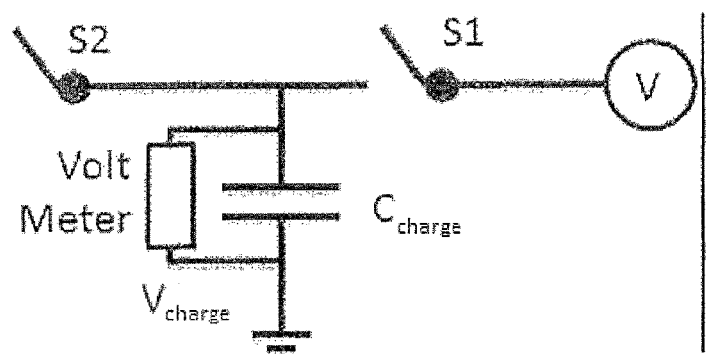
FIG. 7 shows a schematic of a charge sharing circuit according to an embodiment of the invention.

In one embodiment, a charge sharing circuit, such as shown in FIG. 7 can be used to provide a DC voltage for the circuit under test. Referring to FIG. 7, a DC source V with a voltage on the order of the circuit under test is provided at each probe needle. A first switch S1 is used to connect or disconnect the source V from a capacitor ($C_{charge}$) of known capacitance. The voltage $V_{charge}$ across the capacitor is continuously monitored through a voltmeter. A second switch S2 allows the capacitor $C_{charge}$ to be connected or disconnected from the probe needle itself (and thus, the TSVs being contacted by the probe needle).

Because the charge sharing circuit of FIG. 7 can be prone to measurement error caused by leakage currents, an AC capacitance measurement method can be used instead. For example, a capacitive bridge can be included as part of the active driver.

Analog and mixed-signal testers can be used to measure capacitance for the pre-bond TSV defect screening. In certain embodiment, digital testers can be used if capacitance sensing circuits and drivers are added to the digital testers. In addition, if the chip includes additional functionality and I/O interfaces, digital measurements from the digital testers can be used.

For the examples herein, a method using the charge sharing circuit of FIG. 7 is used. However, as mentioned briefly above, this should not be construed as limiting. Indeed, any active driver configuration can be used so long as a selectively connected capacitance is provided that can be charged to a known voltage and monitored.

In accordance with an embodiment of the invention, pre-bond testing of TSVs can be accomplished by contacting a probe needle to a matrix of TSVs according to, for example, the probe card shown in FIG. 5A.

Figure 8A:
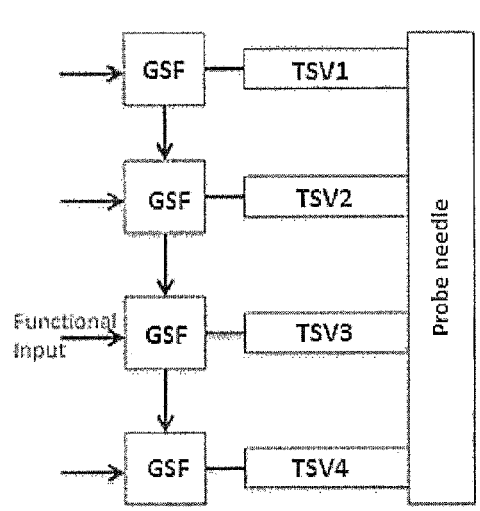
FIGS. 8A and 8B show a representational diagram and equivalent circuit TSV network model, respectively, in accordance with an embodiment of the invention.

A representation of a probe needle contacting a matrix of TSVs is shown in FIG. 8A. The TSVs are connected to gated scan-flops GSFs, which are connected to form a scan chain.

Figure 8B:
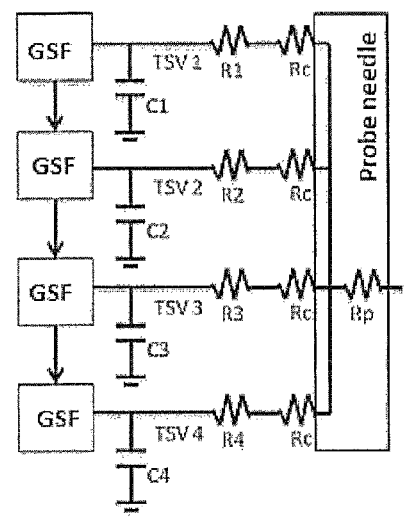

Referring to FIG. 8B, a TSV can be modeled as a wire with both a resistance and a capacitance. The probe needle has a known resistance $R_p$ and a known contact resistance $R_c$ with each TSV. The contact resistance depends on the force with which the probe needle contacts the TSVs. Each TSV has an associated resistance ($R_1$, $R_2$, $R_3$, and $R_4$) and capacitance ($C_1$, $C_2$, $C_3$, and $C_4$). The net capacitance $C_{net}$ of the scan chain is the combined capacitances of all of the TSVs in parallel. $C_{net}$ can be expressed as: $C_{net}=C_1+C_2+ \ldots +C_n$, where n is the total number of TSVs contacted by the probe needle at a particular time.

The net resistance, $R_{net}$ is the equivalent of the probe resistance ($R_p$), contact resistances ($R_c$), and TSV resistances ($R_1$, $R_2$, \ldots, $R_n$), calculated as follows:

$$R_{net} = R_p + \left( \frac{1}{R_1 + R_c} + \frac{1}{R_2 + R_c} + \ldots + \frac{1}{R_n + R_c} \right)^{-1}$$

A. Capacitance Measurements

Figure 9:
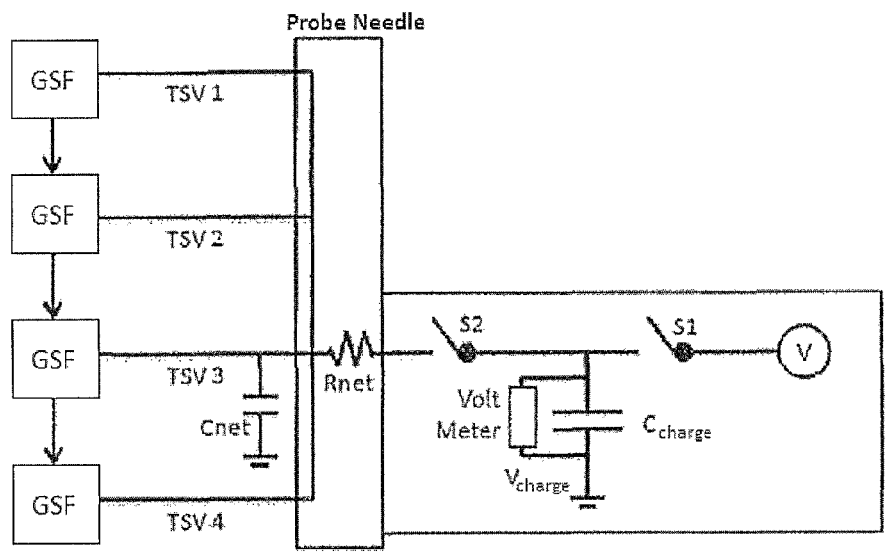
FIG. 9 shows a TSV network with charge-sharing circuit according to an embodiment of the invention.

In order to characterize each TSV, the net capacitance is determined. From this, the capacitance of each TSV can be estimated and their resistances measured. FIG. 9 illustrates a test set-up for characterizing each TSV. In one embodiment, a charge sharing circuit such as shown in FIG. 7 is connected to the probe needle, which shorts together multiple TSVs as shown in FIG. 9.

According to one embodiment of the invention, the capacitance measurements can be carried out by three steps as follows:

1. Discharge the TSV network by loading a 0 (as a test signal input) into all gated scan-flops and then opening their gates using the Open signal. During this step, the second switch S2 is open such that the charge sharing circuit is disconnected from the TSV network, and the first switch S1 is closed to charge capacitor $C_{charge}$ to a known voltage V.

2. Close all gated scan-flops using the Open signal and open switch the first switch S1 to stop charging the capacitor $C_{charge}$. Close the second switch S2 to connect capacitors $C_{charge}$ and $C_{net}$. This sets up the charge-sharing network as $C_{charge}$ is discharged into $C_{net}$.

3. The rate of change of $V_{charge}$ is monitored through the volt meter until the rate of change falls below a certain level. This level corresponds to the rate of change in a simulated charge curve that has reached 1% of its maximum charge during discharge. Once this rate is reached, then a final measurement of voltage $V_{charge}$ across capacitor $C_{charge}$ is taken.

Once these steps are completed, the value of $C_{net}$ can be determined from the measured values using the following charge-sharing equation (1):

$$C_{net} = C_{charge} \frac{(V - V_{charge})}{V_{charge}}$$

From the network capacitance $C_{net}$, the average capacitance of each TSV can be determined by subtracting the known probe needle capacitance and contact capacitance and dividing by the number of TSVs in the network. In this respect, having fewer TSVs in the network will allow for a higher resolution in capacitance measurements, though this is not the case for resistance measurements or stuck-at/leakage tests (described below). Among the TSV defect types, the pinhole defect results in capacitance changes (as opposed to resistance changes), which may also be detected through leakage tests. Although the capacitance measurement using this method yields only an average value, significant increases in capacitance can be readily detectable if the number of TSVs in a network is not too large.

B. Resistance Measurements

The bulk of TSV defects that can be tested pre-bond result in increases in TSV resistance. For this reason, it is important that a pre-bond test be capable of accurately measuring TSV resistance. In order to measure resistance, the charge-sharing circuit of FIG. 7 can also be used. The capacitor $C_{charge}$ will be charged through each TSV, and the time needed to charge the capacitor $C_{charge}$ to a chosen voltage (for example, 99% of $V_{dd}$) is recorded. Long charge times increase the resolution in resistance measurement, but they lead to higher test time. As a tradeoff, smaller voltage levels (such as 90% of $V_{dd}$) can be used to reduce test times if the resolution is acceptable (see Table I).

The TSV resistance measurement can be carried out by simply recording the start time when the control signal ("Open") is asserted for the TSV under test to open and then the end time can be measured when $V_{charge}$ reaches the desired voltage. In order for resistance to be measured, the probing device is calibrated using a non-faulty TSV in a TSV network. This calibration can be performed off-chip prior to testing any circuits, for example by using a dummy silicon chip with double-ended TSVs in which the TSVs themselves can be completely characterized. One or more TSVs on this calibration chip can be used to calibrate the equipment. The charge time of $C_{charge}$ in this environment is determined, and charging times on the test floor are then viewed in relation to the calibrated time.

According to one embodiment of the invention, the resistance measurements can be carried out by the steps as follows:

1. Load all of the gated scan-flops with a 1 and then discharge the TSV network using the probe. During this step, the first switch S1 is open and the second switch S2 is closed such that the capacitor $C_{charge}$ is discharged as well.
2. One of the gated scan-flops is then opened (using the Open signal), allowing the scan-flop to charge $C_{charge}$ through its connected TSV.
3. The voltage $V_{charge}$ is monitored and when $V_{charge}$ reaches a predetermined voltage, the time to charge the capacitor $C_{charge}$ is recorded. This recorded time is then compared to a calibrated charge curve for a non-faulty TSV.

This process of charging and discharging continues for each TSV, which can be completed quickly by incrementing the controlling counter to open each subsequent TSV.

C. Stuck-At and Leakage Tests

Stuck-at and leakage tests can be performed together and in parallel. For strong stuck-at 0 faults or leakage with low resistances to ground, the TSV network can be charged with the gated scan-flops closed and its voltage measured. If the rate of discharge is abnormally high, it can be inferred that a stuck-at 0 fault or a leakage-inducing defect exists on at least one of the TSVs. A parallel stuck-at 1 test can be performed by discharging the TSV network with the gated scan-flops closed and measuring the voltage on the net.

Individual stuck-at and leakage tests can also be performed quickly. This can be performed by loading the scan-chain with a pattern of alternating ones and zeros. The value on the gated scan-flop on the first flop in the control sequence for the TSV network determines whether the net is first charged or discharged. Then, each gated is opened in sequence, making alternating assertions of high or low. The pattern is then shifted by one and the process is repeated once again.

EXAMPLE

Simulation

For the simulations, base line resistance and capacitance values were determined based on expected values according to the materials of the TSVs. While a TSV may be manufactured from a number of different materials, copper is often used for metal layers and polysilicon may be a non-metal alternative. The resistance of a TSV made from copper with a 2-5 µm diameter and 5 µm height is 80-200 mΩ. For a polysilicon TSV with a 28-46 µm diameter and 50 µm height, the resistance is 1.3-5.0Ω. The capacitance of a copper TSV with a 1-10 µm diameter and 30-100 µm height is 10-200 fF.

HSPICE was used to model and obtain experimental results of a TSV network of 20 TSVs. The number 20 was determined based on the relative diameter and pitch of probe leads and TSVs. Unless otherwise stated, the resistance of each TSV and contact resistance is 1Ω and the TSV's associated capacitance is 20 fF. The probe needle resistance is 10Ω. This value is several Ohms higher than contact resistances seen with conventional probe cards to account for the low contact force needed and unusually small features probed in the subject scheme. For the simulations, a schematic such as shown in FIG. 2C, was used for the gated scan flops. The transistors were modeled using predictive low-power 45 nm models. Transmission-gate transistor widths were set to 540 nm for PMOS and 360 nm for NMOS (see transmission gates 221, 241, and 261 of FIG. 2C). These larger widths were chosen such that the gate, when open, would have little impact on signal strength. A strong and weak inverter were used, with the strong inverter (for cross-linked inverters of the first delay stage 231 of FIG. 2C) having widths of 270 nm for PMOS and 180 nm for NMOS, and the weak inverter (for cross-linked inverters of the second delay stage 251 of FIG. 2C) having 135 nm for PMOS and 90 nm for NMOS. These were chosen such that the majority of transistor W/L ratios were 2/1 for NMOS and 3/1 for PMOS. The charge-sharing capacitor $C_{charge}$ was modeled at 10 pF, chosen to be an order of magnitude larger than the fault-free capacitance of the TSV network. This is sufficiently large to achieve good resolution in measurement without being so large that charge times are unreasonable or leakage becomes a significant issue. The power supply voltage $V_{dd}$ for both the probe electronics and the circuit under test was set at 1.2 V.

Inductance was not included in the simulation model because modern probe cards have little parasitic inductance on the probe tips. In addition, sampling takes place in the pin electronics and not through the TSV network itself, so pin electronics are the limiting factor for high-speed sampling and not the TSV network or its contact with the probe needle. Probes capable of GHz sampling frequencies have been available for some time.

Figure 10:
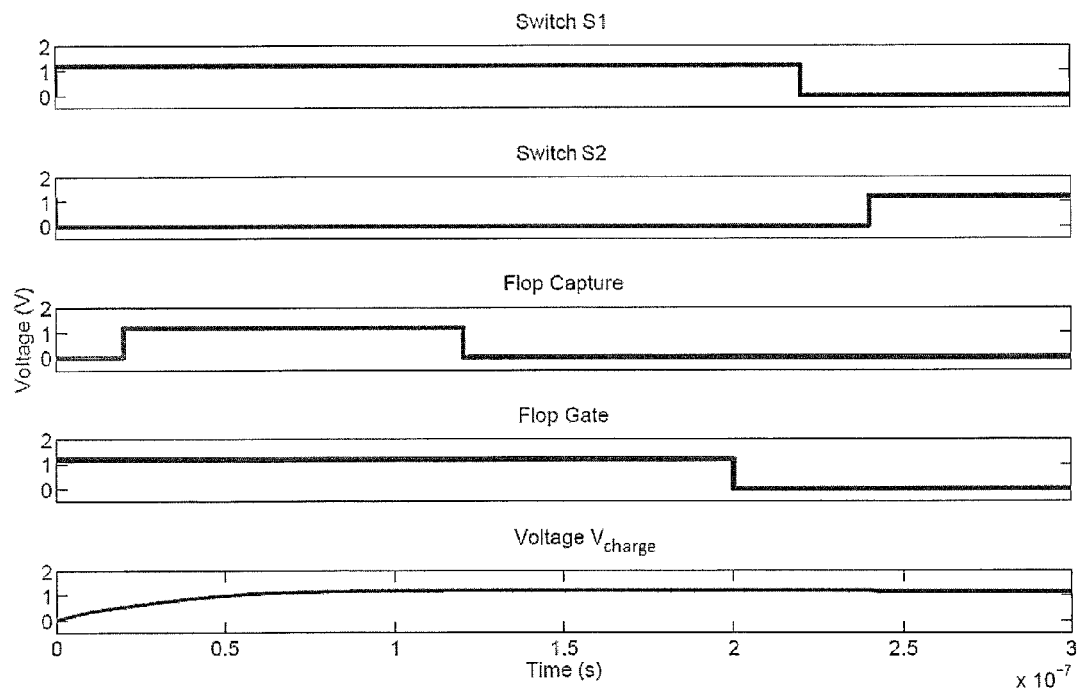
FIG. 10 shows plots illustrating a process of net capacitance measurement in accordance with an embodiment of the invention.

FIG. 10 demonstrates the process of net capacitance measurement, with high signals meaning that a gate is open or a switch is closed. To begin, switch S1 is closed, charging $C_{charge}$ to V. During this time, the gated scan-flops are loaded with a 0 (the Flop Capture signal captures on the falling edge). The flop gates are open as denoted by the Flop Gate signal (applied as the Open signal to the third transmission gate 261 of FIG. 2C). Around time 2, the flop gates are then closed, S1 is opened, and switch S2 is closed to begin charge-sharing. $C_{charge}$ then begins discharging, resulting in the change in the $V_{charge}$ measurement. The voltage is measured after 250 ns when it has settled to 1.15 V. Using Equation 1 and the subsequent division to determine average capacitance, each TSV capacitance was determined to be 20.25 fF, very close to the actual value of 20

Figure 11:
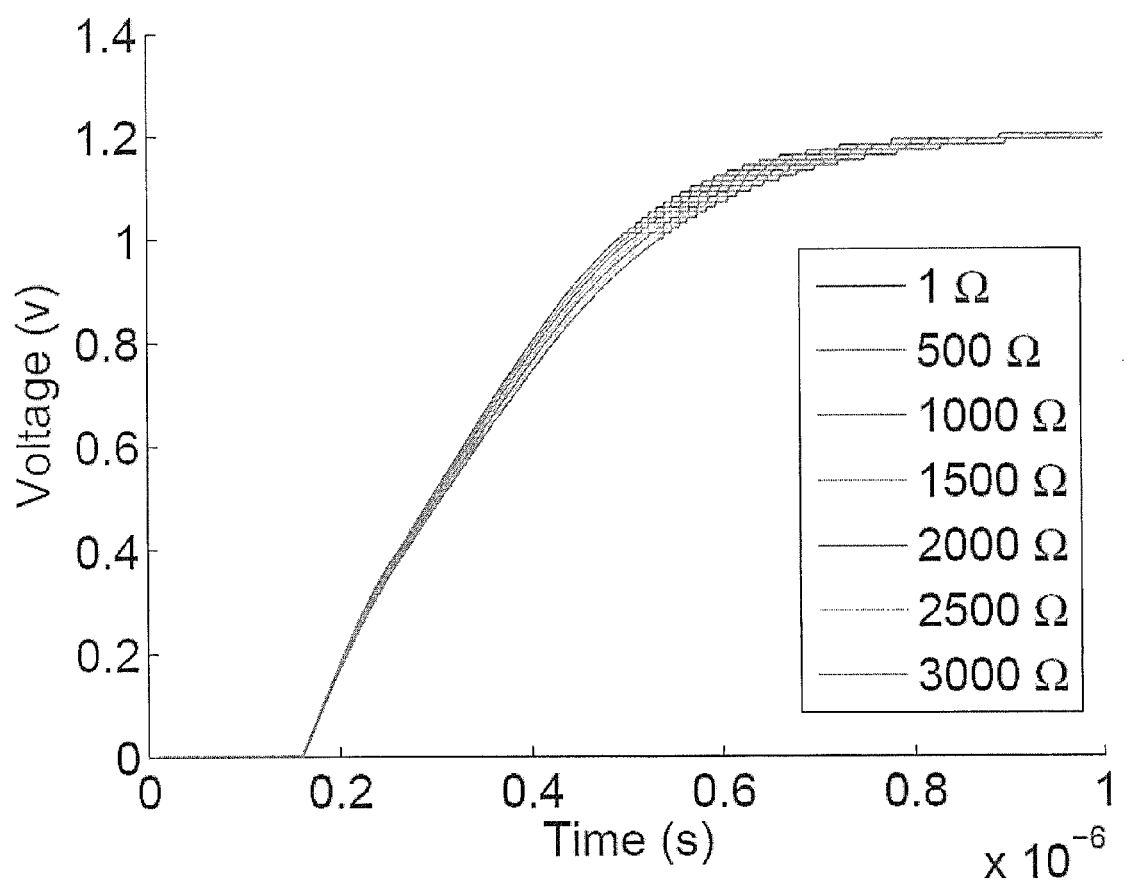
FIG. 11 shows a plot of capacitor charge (voltage) over time illustrating capacitor charging through TSVs of varying resistance.
Figure 12:
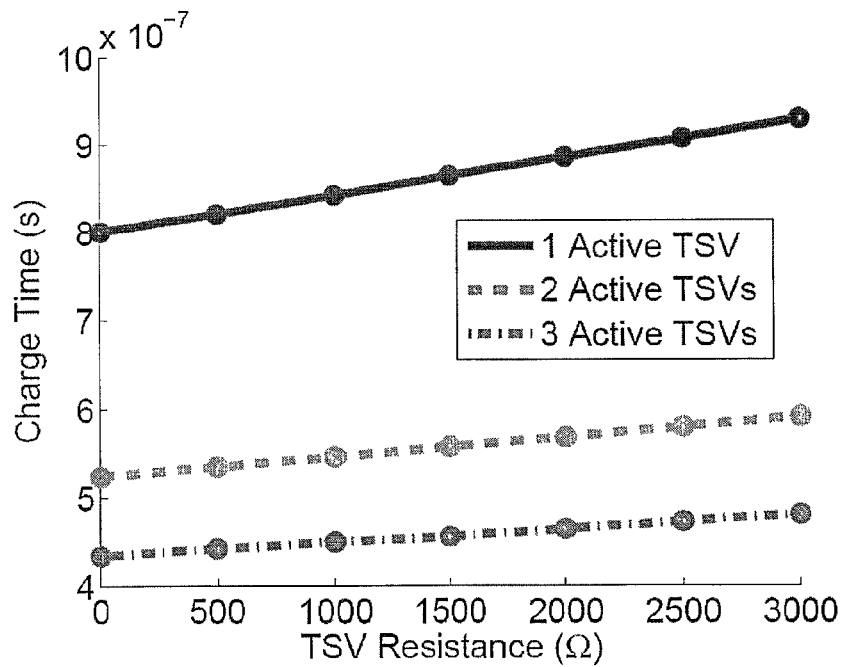
FIG. 12 shows a plot of capacitor charge time at different TSV resistances through one, two, and three TSVs to 0.99 $V_{dd}$.

FIG. 11 shows the charging behavior of capacitor $C_{charge}$ through one TSV in the TSV network. The TSV resistance was varied from 1Ω to 3000Ω in 500Ω intervals. For each TSV resistance value, $V_{charge}$ was recorded when the voltage across $C_{charge}$ reached 99% of $V_{dd}$, or 1.19 V. FIG. 12 shows the charge time to reach this voltage level for each TSV resistance and for one, two, or three TSVs under test in parallel. As can be seen, there is a linear relationship between capacitor charge time and the resistance of the TSV under test. For the capacitance value of 10 pF, each 500Ω increment in TSV resistance results in about a 20 ns increase in charge time (considering only one TSV under test). Assuming a sample rate of 1 GHz and calibration at 1Ω (the first waveform), a resolution of about 25Ω is obtained. Accordingly, each increase in charge time of 1 ns above the calibrated charge time corresponds to a 25Ω increase in resistance on the TSV under test. Higher resolutions can be achieved at the cost of longer charge times by increasing the capacitance of $C_{charge}$. However, if the capacitance is too large then leakage could become a significant source of error.

Generally, the resolution of measurement can be determined using the formula $$\frac{\Delta T}{S \cdot A \cdot \Delta \Omega},$$

where $\Delta T$ is a change in charge time, $\Delta \Omega$ is the TSV resistance difference for that charge time, S is the sample rate, and A is the number of active TSVs.

TABLE I

| Chosen Voltage Level | Smallest Detectable Resistance Change | |
|---|---|---|
| (Percentage of $V_{dd}$) | at 1 GHz (Ω) | at 500 MHz (Ω) |
| 99 | 24.3 | 48.6 |
| 95 | 40.4 | 80.8 |
| 90 | 55.6 | 111.2 |
| 60 | 161.3 | 322.6 |
| 50 | 221.2 | 442.4 |
| 40 | 324.7 | 649.4 |
| 10 | 2777.8 | 5555.6 |

Table I shows the resolution of resistance measurements at 500 MHz and 1 GHz sample rates for different chosen voltage levels, assuming a fault-free TSV with 1Ω resistance and a faulty TSV with 500Ω resistance. For example, the resolution achieved $C_{charge}$ is charged to 99% of $V_{dd}$ implies that resistances as small as 24.3Ω above the nominal 1Ω fault-free resistance can be detected. The lower the entries in the second column of Table I, the larger the resolution and detectability of TSV defects. As the voltage level to which $C_{charge}$ is charged decreases, the resolution achievable by resistance measurements also decreases.

TABLE II

| Actual Resistance (Ω) | Measured Resistance (Ω) | % Difference |
|---|---|---|
| 100 | 110.8 | 10.8 |
| 200 | 207.3 | 3.7 |
| 300 | 304.3 | 1.4 |
| 400 | 401.8 | 0.5 |
| 500 | 499.1 | 0.2 |
| 600 | 596.8 | 0.5 |
| 700 | 695.0 | 0.7 |
| 800 | 793.4 | 0.8 |
| 900 | 891.8 | 0.9 |
| 1000 | 990.8 | 0.9 |

Table II shows the calculated resistance values of several faulty TSVs using the calibration curve shown in FIG. 11 for a single TSV, providing the measurement accuracy at varying faulty TSV resistances. As can be seen, high accuracy is achieved for a range of faulty resistances. Higher resolutions are achieved in the 400-600Ω range, although this is based on a curve calibrated only at every 500Ω. Additional data points in the calibration curve can improve accuracy of the results at other resistance values.

The test time for resistance measurements can be estimated from the voltage level to which $C_{charge}$ is charged and the number of TSVs and TSV networks being tested. For example, consider a die with 10,000 TSVs and 20 TSVs per network, for which $C_{charge}$ is charged to 99% of $V_{dd}$. Due to bandwidth and current limitations of the probe card, it is assumed that only 100 TSV networks can be tested in parallel at a time. From simulations of fault-free TSVs, maximum currents of 46 µA are sinked through each probe needle during resistance measurement. This is well within the present limits of the smallest probe needles (~120 mA for tip diameter of 1.0 mil and ~400 mA for tip diameter of 5 mils), and it is thus likely that more than 100 TSV networks could be tested at a time. The time required for measuring the resistance of all TSVs in this example is 80 µs, not including the time required to move the probe card.

Although resolution may decrease, it is also possible to test the resistance of multiple TSVs in parallel. Referring again to FIG. 12, the charge times when two or three parallel TSVs are under test is provided. In each case, the resistance for all TSVs in the group tested in parallel were increased from 1Ω to 3000Ω in increments of 500Ω. As shown in FIG. 12, the difference in charge times between the chosen TSV resistances decreases to 10 ns for two TSVs in parallel and 5 ns for three. This loss of resolution can be overcome to an extent with a larger capacitance $C_{charge}$, (limited by the leakage error tolerances). In addition, another source of resolution loss lies in the averaging that takes place between the resistances of the TSVs tested in parallel. In certain cases, this loss is acceptable. For example, some averaging may be desireable in the test environment, in which case it would be faster to test groups of TSVs in each TSV network in parallel with each other, and the controller can be designed appropriately.

Figure 13:
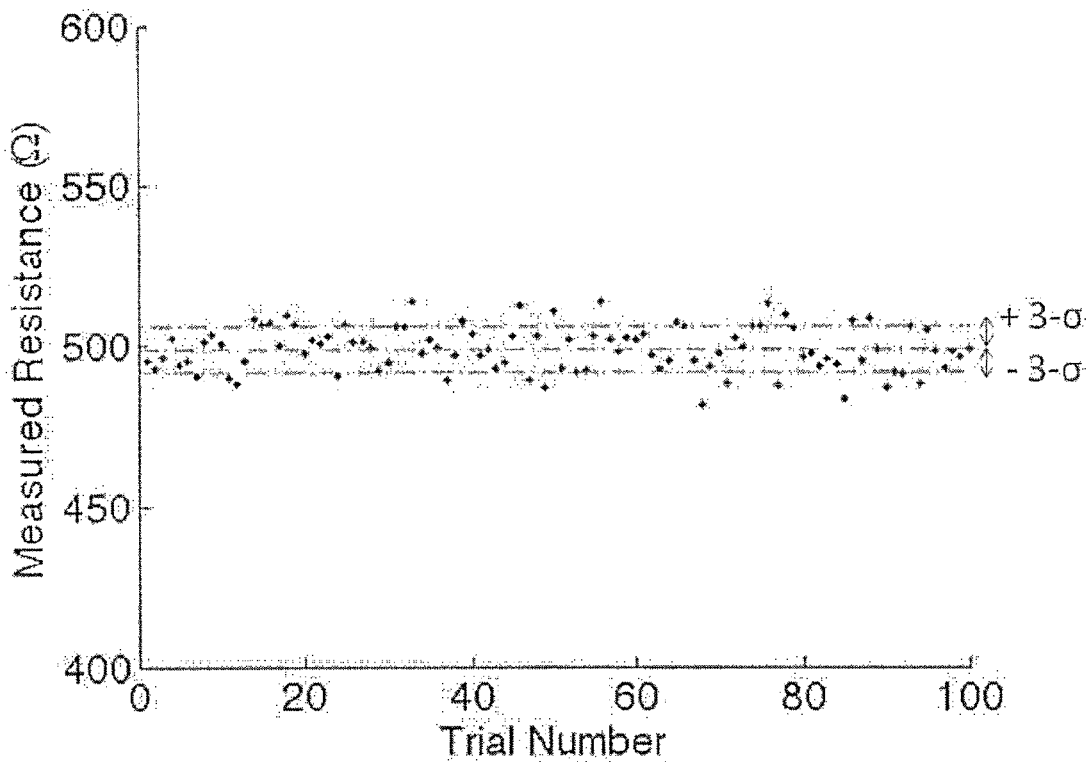
FIG. 13 shows a plot of a 100-point Monte Carlo simulation of resistance measurements with 20% variation in the resistance and capacitance of fault-free TSVs.

The robustness of resistance measurements in a 20-TSV network under process variations was also examined. The TSV under test was considered to have a resistive fault with a total resistance of 500Ω. Resistances on the other TSVs in the network were simulated with a Gaussian distribution in where 3-σ is a 20% spread from the nominal value of 1Ω. All TSV capacitances were simulated with a similar Gaussian distribution using a nominal value of 20 fF. Charge times were then compared to a calibrated curve. As can be seen from a 100-trial Monte Carlo simulation in FIG. 13, the resolution of resistance measurements remains high under process variations, with a mean measurement of 499Ω and a standard deviation of 7Ω.

Figure 14:
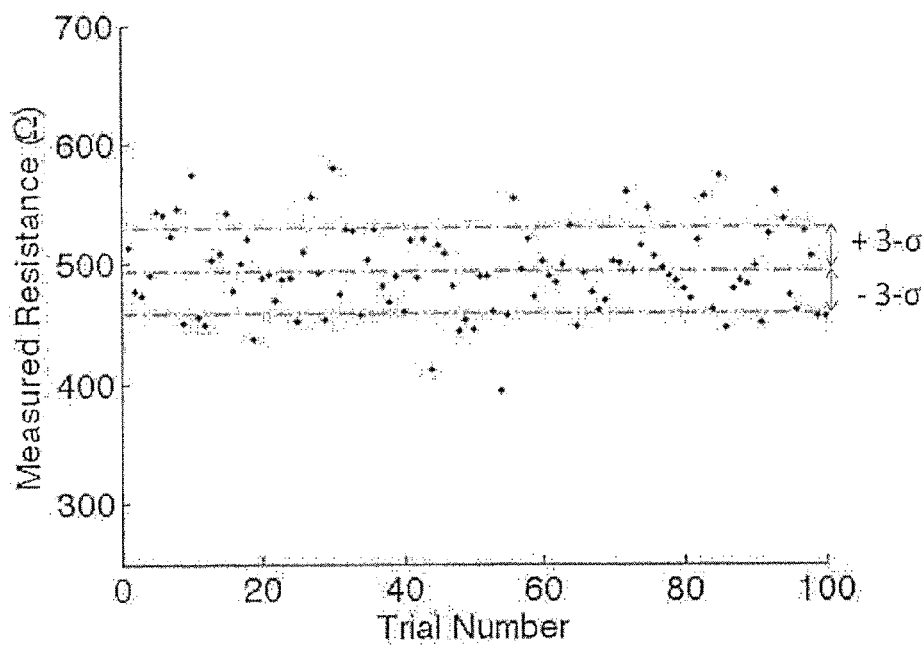
FIG. 14 shows a plot of a 100-point Monte Carlo simulation of resistance measurements for multiple TSV resistive and capacitive defects and under process variations.

The accuracy of resistance measurements in a TSV network where more than one TSV is faulty was examined. The Monte Carlo simulations of FIG. 13 were repeated, this time assuming that each TSV was defective with a probability density function that is Gaussian. The 3-σ value for defective TSV resistance was selected as 1000Ω, and the nominal defect-free TSV resistance was selected as 10. The 3-σ value of the TSV capacitance under process variation is assumed to be 25 pF, with a nominal value of 30 pF. FIG. 14 presents results for a 100-trial Monte Carlo simulation in this scenario. As illustrated in FIG. 14, good resolution in resistance measurements continues to be seen, with a mean of 494Ω and a standard deviation of 35.7Ω. Multiple defective TSVs in the presence of high process variations do not have a large impact on the measurements because a for capacitance $C_{charge}$ that is orders of magnitude larger than the TSV capacitance was chosen. The charge time of this capacitor dominates the much smaller changes in charge time caused by varying RC values in the TSV network.

Figure 15:
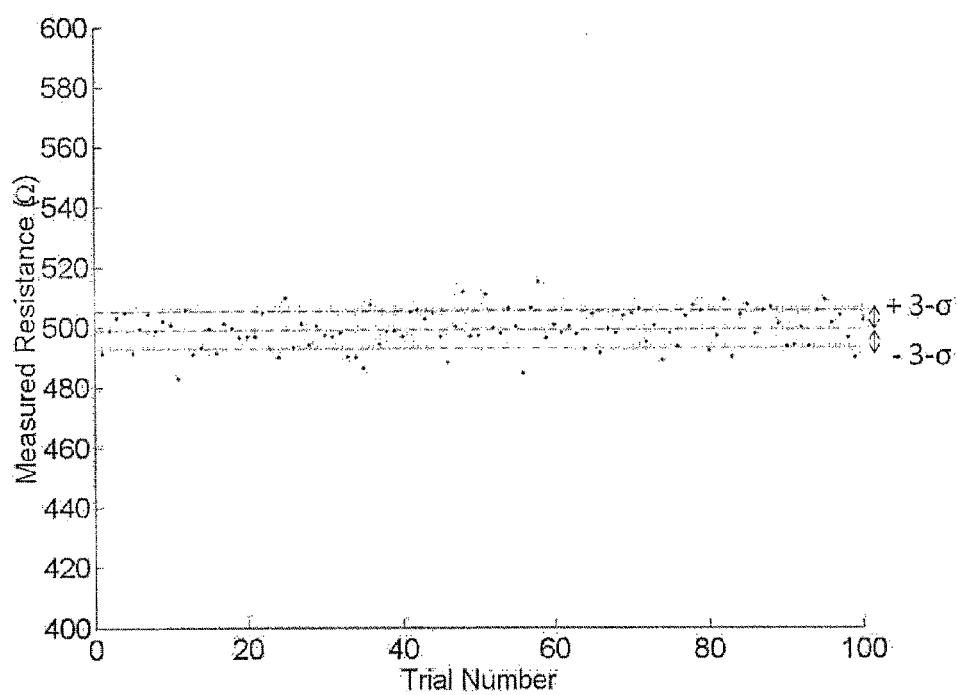
FIG. 15 shows a plot of a 100-point Monte Carlo simulation of resistance measurements for varied TSV contact resistances.

As shown in FIG. 15, the accuracy of the resistance measurements was examined for a TSV network when the contact resistance varies between TSVs. Monte Carlo simulations were performed where a faulty TSV was assigned a 500Ω resistance and each non-faulty TSV was assigned a 1Ω resistance. A contact resistance was added to each TSV with a Gaussian probability density function with a nominal value of 20Ω and 3-σ value of 19Ω. The same charge calibration curves as used with the simulations illustrated in FIGS. 13 and 14 were used but the average expected contact resistance of the TSV under test (20Ω) was subtracted from the result. As can be seen in the results of FIG. 15, accuracy remains high, with an average faulty resistance measurement of 498.8Ω and standard deviation of only 6.2Ω.

These simulation results demonstrate that high resolution in the capacitance and resistance measurements can be achieved, and therefore high accuracy in defect defection can be ensured when one or multiple TSVs are targeted at a time. Results also show that the test outcome is reliable even in the presence of process variations or multiple detective TSVs. Accordingly, the subject on-die architecture can enable pre-bond testing of TSVs using probe technology. By enabling pre-bond testing, yield can be improved and manufacturing cost can be reduced.

All patents, patent applications, provisional applications, and publications referred to or cited herein are incorporated by reference in their entirety, including all figures and tables, to the extent they are not inconsistent with the explicit teachings of this specification.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. An on-chip architecture for through-silicon-via (TSV) testing, comprising:
   a scan flop receiving a clock signal input, a test input, a functional input, and a test select input; and providing a first signal at an output node; and
   an open signal controlled gate element at the output node of the scan flop, the gate element receiving the first signal from the scan flop and providing a Q output to a TSV,
   wherein the gate element receives the open signal to control whether the Q output is floating or takes a value of the first signal.

2. The on-chip architecture for TSV testing according to claim 1, wherein each TSV of a die having the on-chip architecture for TSV testing is connected to receive a corresponding Q output.

3. The on-chip architecture for TSV testing according to claim 1, wherein the gate element comprises a transmission gate.

4. The on-chip architecture for TSV testing according to claim 3, further comprising an output buffer between the output node of the scan flop and the transmission gate.

5. The on-chip architecture for TSV testing according to claim 1, wherein the gate element comprises a tri-state buffer, wherein a control input of the tri-state buffer receives the open signal.

6. The on-chip architecture for TSV testing according to claim 1, wherein the scan flop comprises:
   a MUX receiving the test input, the functional input, and the test select input;
   a first transmission gate passing an output of the MUX to a first delay stage according to the clock signal;
   the first delay stage comprising a first cross coupled inverter pair;
   a second transmission gate passing a value stored in the first delay stage to a second delay stage according to the clock signal; and
   the second delay stage comprising a second cross coupled inverter pair, wherein the gate element is connected to receive the first signal from the second delay stage.

7. The on-chip architecture for TSV testing according to claim 6, wherein widths of transistors in the first cross-coupled inverter pair are greater than those of transistors in the second cross-coupled inverter pair.

8. The on-chip architecture for TSV testing according to claim 1, further comprising a controller configured to output the open signal to the gate element.

9. The on-chip architecture for TSV testing according to claim 8, wherein the controller is further configured to output the open signal to the gate element for each open signal controlled gate element of a TSV matrix, wherein a TSV matrix comprises a number of TSVs that can be contacted by a single probe needle, each of the TSVs being connected to receive a corresponding Q output via the open signal controlled gate element.

10. The on-chip architecture for TSV testing according to claim 9, wherein the controller comprises a synchronous up-counter connected to a decoder directing the open signal to a particular gate element connected to the TSV matrix.

11. A method of pre-bond testing of TSVs of a stacked integrated circuit using the on-chip architecture for TSV testing according to claim 1, the method comprising:
   contacting a probe card comprising a first plurality of probe needles to a die under test (DUT), wherein each probe needle comprises an active driver, the active driver being configured to monitor a capacitance, charge the capacitance to a known voltage, and controllably connect and disconnect the capacitance from the probe needle,
   wherein each probe needle of the first plurality of probe needles contacts a corresponding TSV matrix, wherein each TSV of the corresponding TSV matrix is connected to receive the Q output from a corresponding one gate element; and performing a test on the contacted TSV matrices.

12. The method according to claim 11, wherein the probe card further comprises a second plurality of probe needles, the probe needles of the second plurality being configured to connect to signal pads on the DUT.

13. The method according to claim 11, wherein the probe card comprises a checkerboard configuration for the first plurality of probe needles, wherein the method further comprises:

after testing the TSV matrices contacted by the plurality of probe needles, lifting the probe card and shifting the probe card by an offset amount in order to contact untested TSV matrices; and performing the test on the untested TSV matrices.

14. The method according to claim 13, wherein performing the test comprises determining capacitance of the TSVs of the DUT by performing the sequential steps of:

a) charging the capacitance to the known voltage, applying a first test value to the test input for each scan flop, and applying an open value as the open signal to each gate element;

b) applying a close value as the open signal to each gate element, stopping the charging of the capacitance to the known voltage, and connecting the charged capacitance to each probe needle to allow charge sharing between the contacted TSVs and the charged capacitance; and c) measuring a voltage across the charged capacitance after a predetermined period of time.

15. The method according to claim 14, further comprising:
d) determining each TSV's capacitance by:
calculating $$C_{net} = C_{charge} \frac{(V - V_{charge})}{V_{charge}}$$

for each TSV matrix, where $C_{charge}$ is the charged capacitance, $V_{charge}$ is the measured voltage across the charged capacitance, and V is the known voltage; and subtracting known capacitances associated with the corresponding probe needle from the value $C_{net}$ and dividing the value remaining after the subtracting by the number of TSVs in the TSV matrix.

16. The method according to claim 13, wherein performing the test comprises determining resistance of the TSVs of the DUT by performing the sequential steps of:

a) applying a second test value to the test input for each scan flop, applying a close value as the open signal to each gate element, connecting the capacitance to each probe needle, and discharging all TSVs and the capacitance;

b) applying an open value as the open signal to at least one gate element for each TSV matrix, thereby allowing the connected capacitance to be charged by the TSV having the gate element with the applied open value c) monitoring a voltage across the capacitance, and recording a time to charge the capacitance to a predetermined voltage;

d) comparing the recorded time to a calibrated charge curve of a non-faulty TSV; and e) performing steps (a)-(d) for each remaining TSV in the TSV matrices.

17. The method according to claim 16, wherein applying the open value as the open signal to the at least one gate element for each TSV matrix is performed for one TSV at a time.

18. The method according to claim 16, wherein applying the open value as the open signal to the at least one gate element for each TSV matrix is performed for two or three TSVs at a time.

* * * * *

UNITED STATES PATENT AND TRADEMARK OFFICE
CERTIFICATE OF CORRECTION

PATENT NO.         : 8,775,108 B2
APPLICATION NO.    : 13/172161
DATED              : July 8, 2014
INVENTOR(S)        : Krishnendu Chakrabarty and Brandon Noia Page 1 of 1

It is certified that error appears in the above-identified patent and that said Letters Patent is hereby corrected as shown below:

In the Specification

Column 2,
Line 40, "pre-pond" should read --pre-bond--.

Column 3,
Line 67, "pre-pond" should read --pre-bond--.

Column 10,
Line 8, "each gated is" should read --each gate is--.

Column 11,
Line 12, "value of 20" should read --value of 20 fF--.

In the Claims

Column 16,
Line 20, "open value" should read --open value;--.

Signed and Sealed this
Ninth Day of December, 2014

Michelle K. Lee
*Deputy Director of the United States Patent and Trademark Office*